(12) United States Patent
Thorne

(10) Patent No.: US 7,504,637 B2
(45) Date of Patent: Mar. 17, 2009

(54) TWO COMPONENT PHOTODIODE DETECTOR

(75) Inventor: Sean L. Thorne, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 224 days.

(21) Appl. No.: 11/456,662

(22) Filed: Jul. 11, 2006

(65) Prior Publication Data

US 2008/0011959 A1 Jan. 17, 2008

(51) Int. Cl.
*G01T 1/24* (2006.01)

(52) U.S. Cl. .................................................. 250/370.09

(58) Field of Classification Search ............ 250/370.09, 250/370.11
See application file for complete search history.

(56) References Cited

U.S. PATENT DOCUMENTS 5,811,790 A * 9/1998 Endo et al. ............... 250/208.1
6,510,195 B1 * 1/2003 Chappo et al. ................ 378/19

\* cited by examiner

*Primary Examiner*—Constantine Hannaher
(74) *Attorney, Agent, or Firm*—Williams J. Kubida; Michael C. Martensen; Hogan & Hartson LLP

(57) ABSTRACT

A photodiode detector array is bonded to a first surface of a first substrate and electrically coupled to the second surface of the first substrate. A shield, opaque to X-ray radiation is attached to the second surface of the first substrate. A processing chip is flip chip bonded and electrically coupled to the first surface of the second substrate. A portion of the first surface of the second substrate is physically and electrically joined to a portion of the second surface of the first substrate so as to allow processing of electrical signals from the photodiode array. The shield associated with the first substrate is aligned so as to prevent X-ray radiation from reaching the processing chip associated with second substrate. The shield and the processing chip are separated by an air space providing thermal and electrical isolation.

20 Claims, 7 Drawing Sheets

TWO COMPONENT PHOTODIODE DETECTOR

BACKGROUND OF THE INVENTION

1. Field of the Invention

The present invention relates, in general, to detector arrays and, more particularly, to a two component configuration of an X-ray photodiode detector sensor array having a flip chip bonded application specific integrated circuit.

2. Relevant Background

Modern X-ray computer tomography (CT) scanners commonly employ several hundred X-ray detectors to convert X-ray energy into visible light and ultimately into electrical signals. A detector is usually composed of a scintillator to convert X-ray energy into light and a photodiode to convert that light into an electrical current. The formats of photodiodes used in CT applications can range from a single element, 1-D array to a multi-element, 2-D array.

Each active photodiode array comprises a series of scintillation crystals arranged on a substrate for converting X-ray radiation into light. Under each scintillator crystal is a back-illuminated photodiode that converts the light emitted from the scintillation crystals into an electrical charge. The electrical charge from the photodiodes is then conveyed via an electrical path to a signal processing circuit. Typically, the converted electrical charge leaves each photodiode via electrical connections through a plurality of paths in a substrate to the processing circuitry using a wire bonding technique as is commonly known in the art. The substrate serves both as a supporting mechanical foundation for the circuitry and the photodiode assembly, and as a means to house a shield to protect the processing circuitry from stray radiation.

FIG. 1 provides a plan and side view of a highly abstract rendition of a typical photodiode array 100 as is known in the art. A scintillator crystal 110 is typically a six-sided cube that receives X-ray radiation 105 wherein the one transparent face is bonded to a photodiode 140. The juncture between the scintillator crystal 110 and the photodiode 140 is normally a p+ on n− mating. The remaining sides of the crystal 110 are covered with an optically reflective material that facilitates channeling the light generated by the crystal to the transparent face and ultimately to the photodiode 140 below. The photodiode is thereafter connected to processing circuitry 160 via electrical paths amidst a substrate 150. Interposed between the substrate 150 and the processing circuitry 160 is a radiation shield 145. The shield 145 protects the processing circuitry from stray radiation that may result in false readings, imaging, and ghosting.

As illustrated schematically in FIG. 1, a substrate 150 provides the basic structural support of the prior art detector array. Photodiodes 140 are arranged on the substrate 150 in a 2-D array. The substrate 150 also includes a signal transmission means 170 for transmitting electrical signals generated by each photodiode 140 to the signal processing circuitry 160 for image reconstruction. The processing circuitry associated with each electrical signal from each active photodiode element is typically a Complementary Metal-Oxide Semiconductor ("CMOS") chip. CMOS is a major class of integrated circuits. CMOS chips include microprocessor, microcontroller, static RAM, and other digital logic circuits. A wire bond typically connects a top surface bond pad on one end of the photodiode to an external connection on the CMOS chip.

The signal transmission arrangement typically includes electrically conductive circuit paths 170 (wires) printed into the substrate. Electrically conductive leads from each photodiode 140 to one or more of the paths 170 complete an electrical connection between each photodiode 140 and the processing circuitry 160. As the number of photodiodes 140 in each array grows, the complexity of the substrate supporting the numerous electrical wires required for the array also expands. As will be appreciated by one skilled in the art, substrates can comprise of multiple layers to accommodate in excess of 500 individual circuit paths.

As will also be appreciated by those skilled in the art, manufacture of the prior art X-ray detectors such as that shown in array FIG. 1 tends to be complex and labor intensive due to the precautions necessary to insure its reliable construction. For example, each connection 170 between each photodiode 140 and the processing circuitry 160 must be bonded, and carefully looped, such that the wire 180 when bonded to a circuit path on the substrate 150 does not interfere with other wires or other conductive areas on the substrate 150. The wire bond density becomes acute for 2-D arrays. A conductive trace from each inner photodiode element in a 2-D array must be connected to the "outside world". One trace is required per element and each trace usually terminates in a bond pad on substrate 150. Wire bonds from each bond pad are then made to external connections.

As the number of these external connections increase so does the cost associated with the substrates associated with the photodiode array. Until recently, the size and number of the photodiodes in the detector array was normally the most significant factor in the design of such components. Advancements in bonding and the ability to position large numbers of detectors in a single array has shifted the allocation of costs of these components to the design and manufacturing of the substrates and their ability to carry hundreds of independent electrical signals. Substrates capable of conveying the signals for some 500 diodes are often on the order of 10-12 layers thick. To create such a substrate that is not only reliable but also possesses sufficient electrical leads and has thermal expansion characteristics consistent with the photodiode detector array to which it is bonding is difficult and expensive.

Therefore, it is an object of the present invention to provide a 2-D photo-detector array with a simplified structure leading to lower manufacturing costs. It is a further object of the invention to provide an improved X-ray detector having improved component verification, greater durability, and reliability, which is substantially less costly to manufacture than prior art X-ray detectors.

SUMMARY OF THE INVENTION

Briefly stated, the present invention involves an improved two component 2-D photo-detector device. A photodiode detector array is bonded to a first surface of a first substrate and electrically coupled to the second surface of the first substrate. A shield, opaque to X-ray radiation, is attached to the second surface of the first substrate. A processing chip is flip chip bonded and electrically coupled to the first surface of the second substrate. A portion of the first surface of the second substrate is physically and electrically joined to a portion of the second surface of the first substrate so as to allow processing of electrical signals from the photodiode array. The shield associated with the first substrate is aligned so as to prevent X-ray radiation from reaching the processing chip associated with second substrate. The shield and the processing chip are separated by an air space providing thermal and electrical isolation.

In one aspect of the present invention, the two component substrates are joined by BGA bonding. The shield associated with the first substrate is substantially composed of a material opaque to X-ray radiation such as Tungsten, Gold, or other elements having an atomic number in excess of 70. The dimensions of the shield are as large or larger than the processing chip to prevent X-ray radiation from reaching the processing chip. In yet another aspect of the present invention, the processing chip can be encapsulated. The operational functionality of each substrate and its associated components are independently determinable.

The foregoing and other features, utilities and advantages of the invention will be apparent from the following more particular description of an embodiment of the invention as illustrated in the accompanying drawings.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

The Figures depict embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF THE PREFERRED EMBODIMENTS

A two component 2-D photodiode detector array is illustrated and described in terms of the aforementioned Figures and the following text. A 2-D photodiode detector array is disclosed comprising two substrates wherein a circuit die is flip chip bonded to one substrate while a radiation shield and a photodiode array is bonded to the other. The two substrates are thereafter bonded together providing a means for transmission of the electrical signals generated from each photodiode to the circuit die. The shield is orientated so as to overlay yet directly oppose the circuit die when viewed from the perspective of the photodiode array. Furthermore, the circuit die and shield are positioned so to not touch creating a thermally and electrically insulating space between the circuit die and the shield.

Figure 1A:
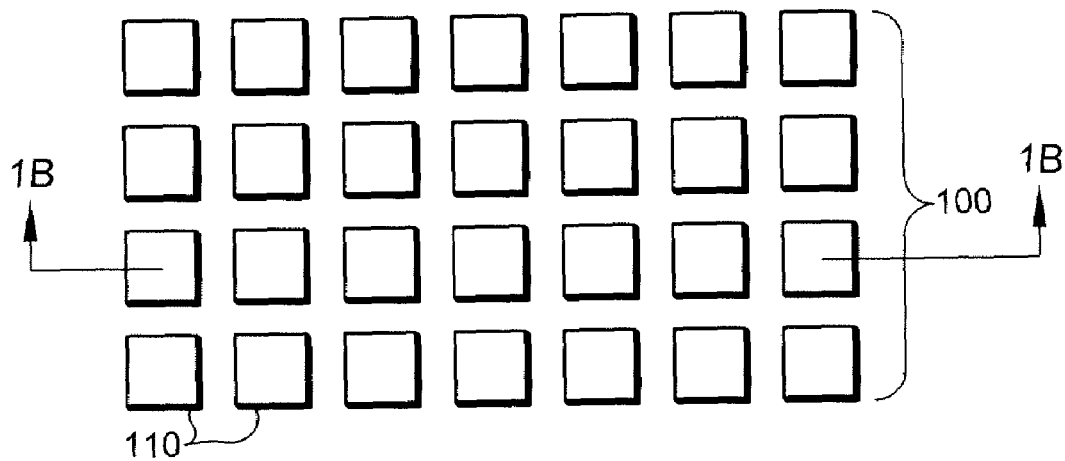
FIG. 1 provides a plan and side (cross section) view of a highly abstract rendition of a typical photodiode array as is known in the art.
Figure 1B:
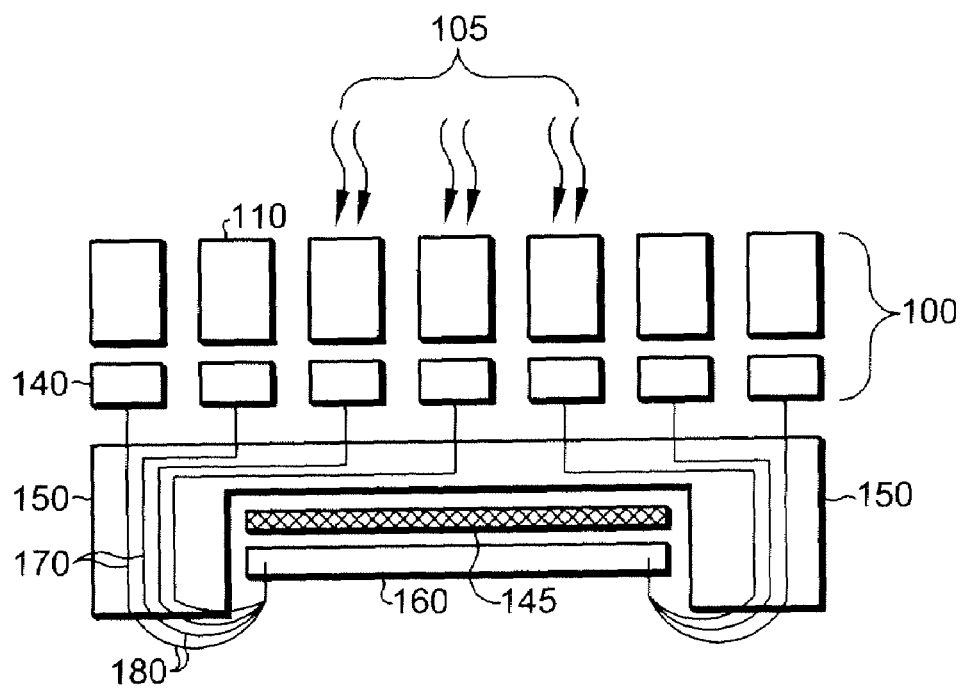
Figure 2:
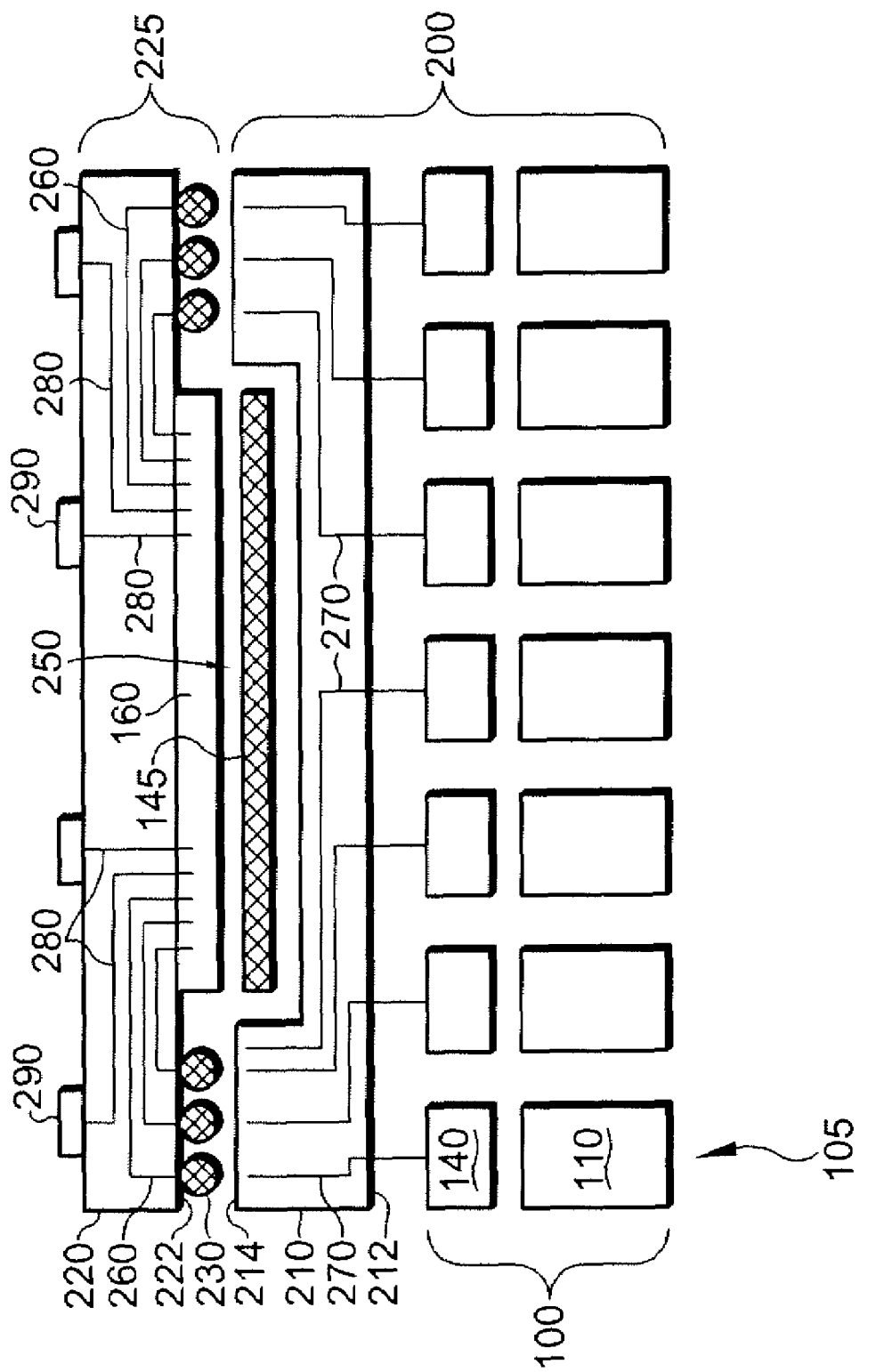
FIG. 2 shows a side view of an abstract rendition of one embodiment for a 2-D photodiode detector array according to the present invention.

FIG. 2 shows a side view of a 2-D photodiode detector array according to one embodiment of the present invention. According to the present invention and as shown FIG. 2, a first substrate component combination 200 and a second substrate component combination 225 are joined forming a photodiode detector array. X-ray radiation 105 or other types of detectable energy such as light, magnetic, thermal, etc. impact the photodiode array 100 resulting in the generation of an electrical signal. In one embodiment of the present invention, the photodiode array is comprised of two or more scintillator crystals 110 bonded individually to photodiodes 140. X-ray radiation 105 impacts scintillator crystal 110 causing the generation of light. The six-sided scintillator crystal is coated on five sides with reflective material so as to drive the generated light to the photodiode 140. The photodiode 140 thereafter generates an electrical signal that is available for processing.

The techniques for bonding of each scintillator crystal 110 to each photodiode 140, and the p+ to a n− juncture that results, is well known to one skilled in the relevant art. In one embodiment of the present invention, the array of photodiodes 100 is bonded directly to the first substrate 210. Contact pads located on the first surface 212 of the first substrate 210 are aligned with and make contact with each photodiode 140. Each contact is capable of conveying the electrical signal produced by each photodiode to the substrate and ultimately to the circuit die 160. The first substrate 210 thus possesses two or more transmission means 270 or paths capable of transmitting the electrical signals from each photodiode 140 to a corresponding connecting point on a second surface 214 of the first substrate 210. Each path is individually routed through the substrate so as to isolate each electrical signal. Furthermore, the transmission paths are configured to minimize electromagnetic interference that may result in spurious signal generation, noise, and image ghosting.

The first surface of the first substrate 212 is substantially planar. The planar nature of the photodiode array 100 requires the first substrate to possess sufficient rigidity to support the photodiode array 100 while minimizing cost, weight, and other design considerations. One significant design consideration of the first substrate is its thermal coefficient of expansion. While a significant portion of the energy in each X-ray 105 is ultimately transformed into an electrical signal, a biproduct to the conversion of X-ray to light and the light to electricity is heat. As the intensity of the X-rays 105 impacting each crystal 110 will vary, so will the heat generation throughout the array 100. Furthermore, the placement of the circuit die 160 in contact with the first (or single) substrate also serves as a significant source of heat. A significant design consideration, therefore, is ensuring that the first substrate's 210 coefficient of thermal expansion closely matches that of the photodiode array 100. Distortion of the first substrate 210 can result in unreliable connections between the photodiodes 140 and the substrate 210 as well as cross talk and other undesirable imaging problems. The prior art's ability for the substrate to match the thermal gradients experienced by the photodiode array 100 has been limited due in part to the necessity placed on a single substrate of the prior art to convey a large number of electrical signals to the circuit die 160 via wire bonds. The present invention minimizes the number of layers required in the first substrate 210 thus decreasing both complexity, thermal gradient issues, and cost.

Associated with the first substrate 210 is a shield 145. The shield is composed of a material of high atomic number that is opaque to X-ray radiation. Tungsten, Gold and other elements with an atomic number in excess of 70 meet this requirement. While the combination of the photodiodes 140 and the scintillator crystals 110 of the photodiode array 100 capture the vast majority of X-ray radiation 105, it is possible that spurious X-rays or X-rays that travel between a scintillator crystal 110 and photodiode 140 combination may reach the circuit die 160. The first substrate 210 is characteristically composed of a material that is electrically insulating but is nonetheless transparent to X-ray radiation. To prevent X-ray radiation from reaching the circuit die 160, a shield is interposed between the photodiode detector array 100 and the circuit die 160. The dimensions of the shield are such so that the shield 145 is as large or larger than the circuit die 160. The shield 145 is positioned on the first substrate 210 in relation to the circuit die 160 so as to block any X-ray radiation that may pass through the photodiode array 100. In one embodiment of the present invention, and as shown in FIG. 2, the shield 145 occupies a concave or recessed region of the first substrate 210. While other configurations are possible and contemplated by the present invention, in this embodiment the shield 145 is recessed so as not to extend above the second surface 214 of the first substrate 210.

The second substrate combination 225 includes the circuit die 160, passive electronic components 290 and the means 270 for transmitting electrical signals from the first substrate 210 to the circuit die 160 and from the circuit die 160 to and from 280 the passive electronic components 290. Thereafter the electric signal interacts with the system in which the two component 2-D photodiode detector array is part. In one embodiment of the present invention, the second substrate 160 is electrically joined to the first substrate 210 using a ball-grid array 230.

Ball-grid arrays (BGA) are IC packages which place output pins in the form of solder ball matrix. The traces of BGA are generally fabricated on laminated substrates (BT-based) or polyimide-based films. Therefore, the entire area of substrates or films can be used to route the interconnection between components. The BGA 230 further lowers ground or power inductance by assigning ground or power nets via a shorter current path to PCB. Thermally enhanced mechanism (heat sink, thermal balls, etc.) can also be applied to the BGA to reduce the thermal resistance and act as a heat transfer mechanism from the first substrate 210 to the second substrate 220.

Figure 4A:
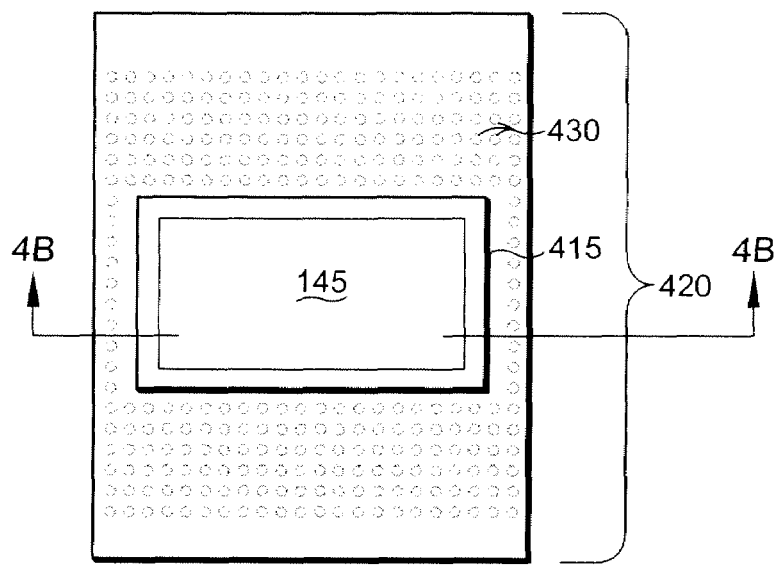
FIG. 4 is a top, side (cross section) and bottom view of one embodiment of a first substrate and shield combination component for a photodiode detector array according to the present invention.
Figure 4B:
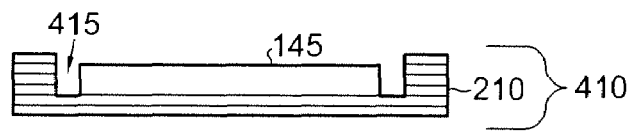
Figure 4C:
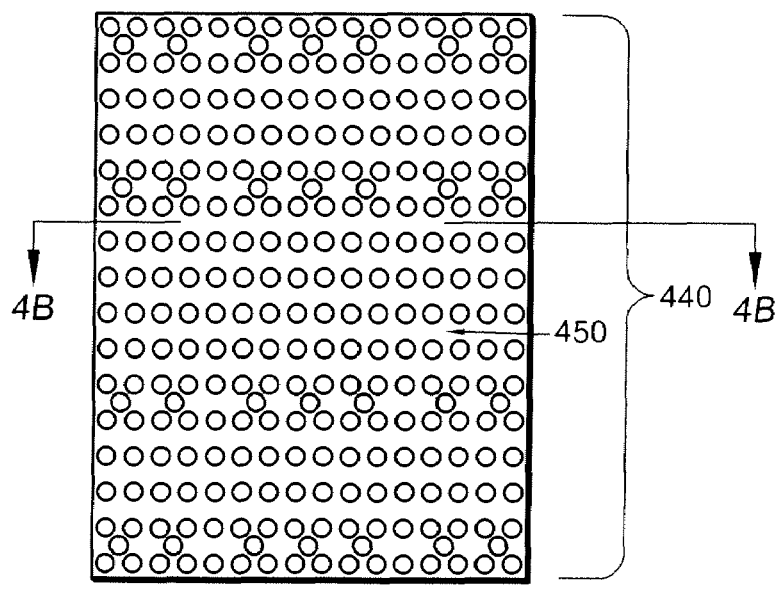
Figure 5A:
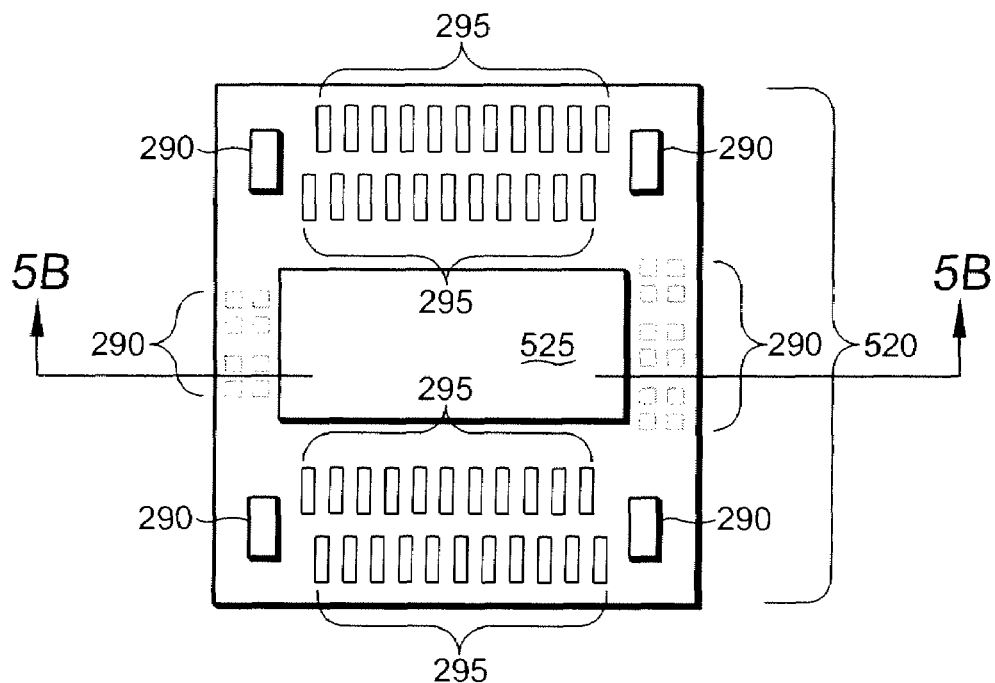
FIG. 5 is a top, side (cross section) and bottom view of one embodiment of a second substrate and circuit die combination component for a photodiode detector array according to the present invention.
Figure 5B:
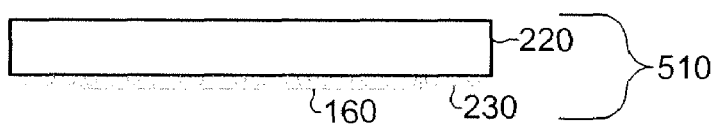
Figure 5C:
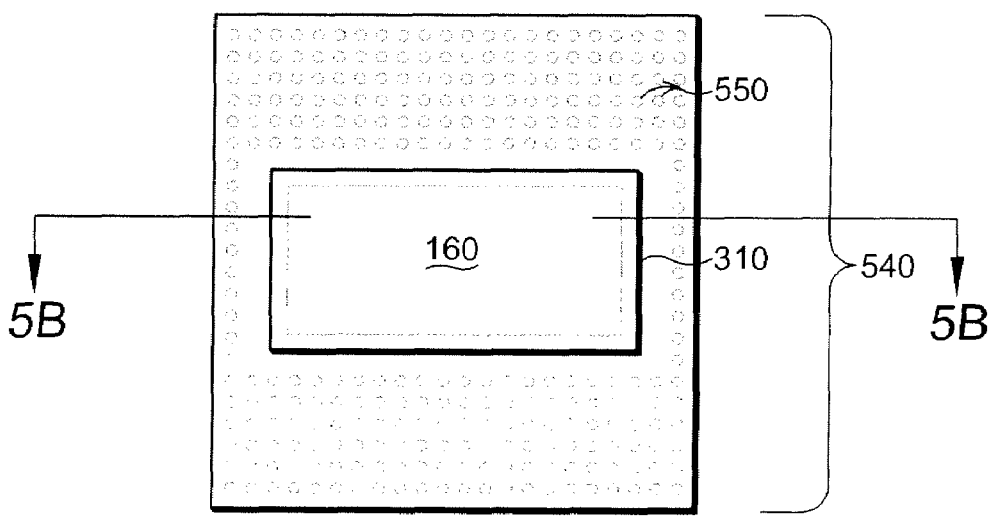

The BGA 230 acts to connect each transmission path 270 of the first substrate 210 to a corresponding transmission path 260 of the second substrate 220. A grid of connecting points (as shown in FIG. 4) on a portion of the second surface 214 of the first substrate 210 are aligned with and connected via the BGA 230 to a grid of receiving points (as shown in FIG. 5) on a portion of the first surface 222 of the second substrate 220.

As is shown in FIGS. 2-5, only a portion of the joining surfaces of the two substrates mate, the second surface 214 of the first substrate 210 and the first surface 222 of the second substrate 220, creating a region for placement of the shield 145 (associated with the first substrate 210) and the circuit die 160 (associated with the second substrate 220). In one embodiment of the present invention, the circuit die 160 is flip chip bonded to the first surface 222 of the second substrate 220. As described above, the circuit die 160 is positioned on the first surface 222 of the second substrate 220 so as to overlay the shield 145 associated with the first substrate 210. FIG. 2 shows the circuit die 160 flip chip bonded to the planar first surface 222 of the second substrate 220. In other embodiments, the first surface 222 of the second substrate 220 may be concave or possess a recessed region wherein the circuit die's 160 exposure beyond the planar surface 222 of the second substrate 220 is reduced.

The joining of the two substrates using the BGA 230 and the positioning of the shield 145 and the circuit die 160 are constrained to create a region between the circuit die 160 and the shield 145 that is void of any object or material. This air space 250 creates a thermal and electrical insulating region between the shield 145 and the circuit die 160. Due to this thermally insulating space, the heat generated by the photodiode array 100 is not conveyed to the circuit die 160. Similarly, heat generated by the circuit die 160 and the passive electronic components 290 associated with the second substrate 220 is not conveyed to the photodiode array 100. In addition, the lack of actual contact between the shield 145 and the circuit die 160 negates the requirement of having an electrically insulating barrier between the two components. This and other advantages of the present invention act to reduce the cost of manufacturing and are of considerable improvement over the prior art.

Another aspect of the present invention is the flip chip bonding of the circuit die 160 to the second substrate 220. Flip chip bonding uses solder bumps similar in concept to BGA but with considerably increased refinements and tolerance requirements. Wafer bumping, as it is referred to, is an advanced packaging technique where bumps or balls made of solder are formed on the substrates before being diced into individual chips. Bumping is an essential process in flip chip packaging, which connects the components face down, directly with the substrate or board through conductive bumps on the chip pads. These bumps provide the electrical, mechanical and thermal interconnection, hence, providing direct contact between the chip package and the device. This type of bonding possesses considerable advantages as opposed to traditional wire bonding.

Flip chip derived its name from the method of flipping over the chip to connect with the substrate. Unlike conventional interconnection through wire bonding, flip chip uses solder or gold bumps. The input/output pads are distributed all over the surface of the chip and not only on the peripheral of the chip as in BGA and other techniques of the prior art. Flip chip bonding allows the circuit or transmission path to be optimized. Another advantage of flip chip is the absence of bonding wire and thus reducing signal inductance and interference. Flip chip bonding or interconnection also reduces signal propagation delay and relieves the constraints of power and ground distribution. Finally, by replacing wire bonding, flip chip interconnects reduce the size and weight and cost of the package.

Figure 3:
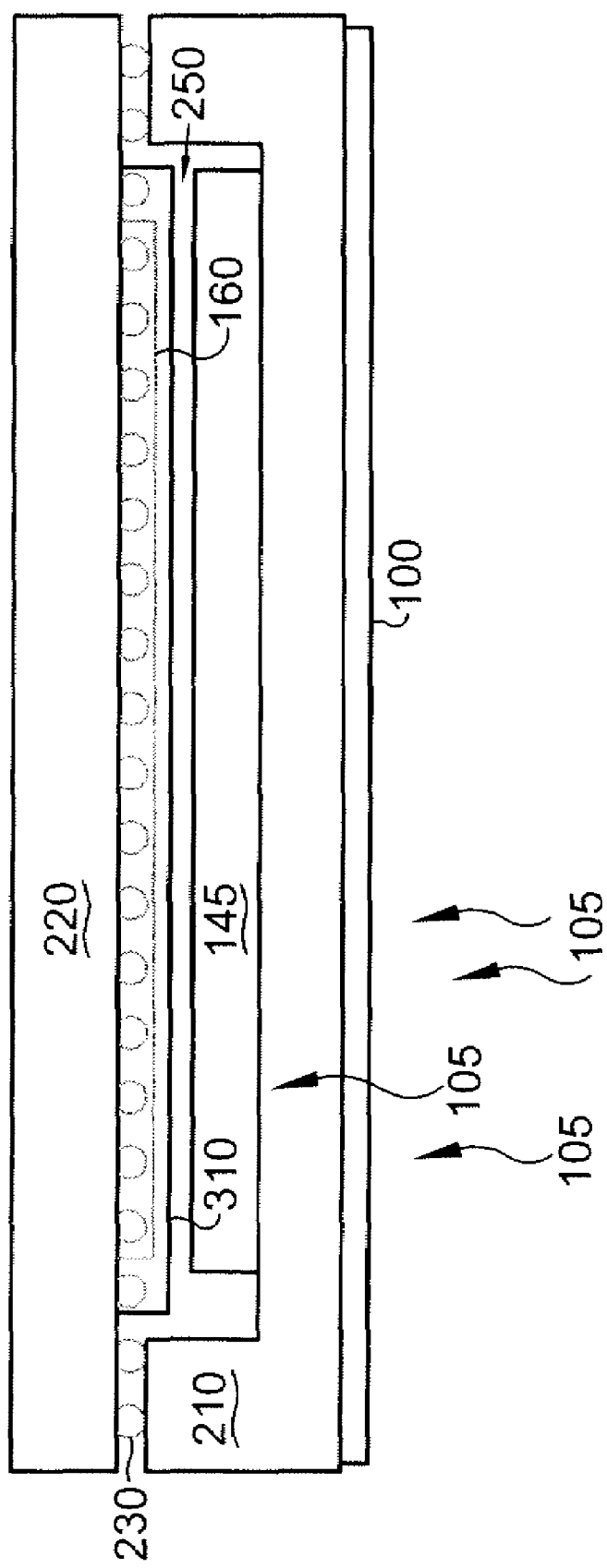
FIG. 3 shows a side view of a 2-D photodiode detector array having an encapsulated circuit die according to one embodiment of the present invention.

FIG. 3 shows a side view of a photodiode detector array according to one embodiment of the present invention. FIG. 3 is a more representative rendition of a two component 2-D photodiode array with respect to the relative dimensions of the various components. In this embodiment of the present invention, the shield 145 is recessed in a cavity of the first substrate 210 so that the top surface of the shield is below the planar surface of the first substrate 210. The size of the BGA 230 in relation to the dimensions of the circuit die 160 are such that the circuit die 160 extends into the cavity of the first substrate 210. A further enhancement to the present invention is shown in FIG. 3 as an encapsulation 310 of the circuit die 160. The modular nature of the two substrates enables each substrate component combination 200, 225 to be tested and verified independently. As the circuit die represents fragile electronic components, it may be advantageous to encapsulate the circuit die 160 with a protective and in another embodiment of the present invention, an electrically insulating cover. Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

As shown in FIG. 3, the circuit die 160 is not in contact with the shield. The space 250 remains between the two components both thermally and electrically insulating them from each other. The encapsulation 310 of the circuit dies 160 add yet another level of isolation between the shield 145 and the circuit die 160. As the dimensions for a component design of this size are in the order of microns, an insulating layer adds increased reliability that the shield 145 will not contact the circuit die 160.

FIG. 4 shows a top, side (cross sectional) and bottom view of the first substrate component combination according to one embodiment of the present invention. The side view 410 of the first substrate 210 shows a recessed region 415 partially occupied by the shield 145 (note that the photodiode array is not shown in FIG. 4). In the embodiment shown in FIG. 4, the first substrate is composed of 6 layers. Each layer of the substrate is capable of multiple transmission paths 270 for carrying electrical signals from the photodiode array 100 to the second substrate 220 and ultimately to the circuit die 160. The top view 420 of the first substrate 210 shows a BGA 430. Each circle represents a solder ball consistent with the description and functionality of a BGA. Note that the BGA 430 occupies only a portion of the second surface 212 of the first substrate 210. As viewed from the top, the recessed region 415 and the shield 145 itself are shown not to possess any solder bumps associated with the BGA.

The bottom view 440 of the first substrate shows a grid pattern 450 of contact pads consistent with the photodiode array 100. Each photodiode 140 is bonded to the first substrate 210 via one of the contact pads shown in the grid pattern 450. Each contact pad of the grid pattern 450 corresponds to and is connected via an electrically conductive transmission path to the BGA pattern 430 shown on the top view 420 of the first substrate 210. The actual placement of the contact points for both the BGA pattern 430 and the grid pattern 450 for the photodiode array 100 may vary as will be appreciated by one skilled in the relevant art.

FIG. 5 shows a top, side (cross sectional) and bottom view of the second substrate component combination according to one embodiment of the present invention. The second substrate 220 and the circuit die 160 are shown in the various views of FIG. 5. The top view 520 shows a substantially planar second surface of the second substrate 220. The various blocks shown on the top view 520 of the second substrate represent various passive electronic components 290 that are connected to the circuit die 160 via electrically conductive transmission paths and system interconnects 295 that connect the array to the system in which the array is implemented. In one embodiment of the present invention, a heat sink 525 is positioned on the second surface of the second substrate 220. The heat sink 525 is coupled thermally to the substrate and the circuit die 160 to control thermal expansion, contraction, and/or distortion of the second substrate 220. The side view 510 depicts solder bumps 230 associated with the BGA grid for connecting the second substrate 220 to the first substrate 210 and the circuit die 160. In this particular embodiment of the present invention, the circuit die 160 is show as extending from a substantially planar first surface 222 of the second substrate 220. In other embodiments, the circuit die may be positioned in a recessed region or cavity within the second substrate 220.

The bottom view 540 of the second substrate 220 shows a rendition of the first surface 222 of the second substrate 220. The BGA pattern 550 shown on this surface corresponds directly to the BGA pattern found on the second surface 214 of the first substrate 210 (see FIG. 4). Each bump of the BGA aligns a connector point located on the second surface 214 of the first substrate 210 with a receiving point located on the first surface 222 of the second substrate 222. Also shown in the bottom view 540 of the second substrate 220 in FIG. 5 is the circuit die 160 and an encapsulating cover 310.

Figure 6A:
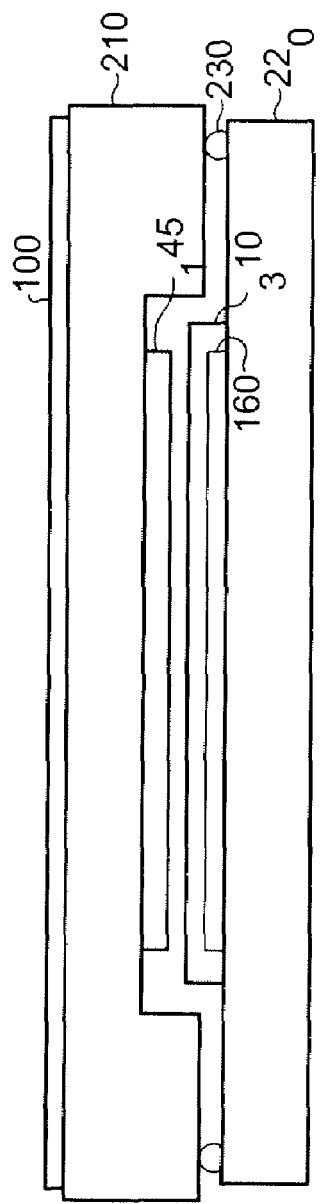
FIG. 6 shows opposing side views of one embodiment of a photodiode detector array according to the present invention.
Figure 6B:
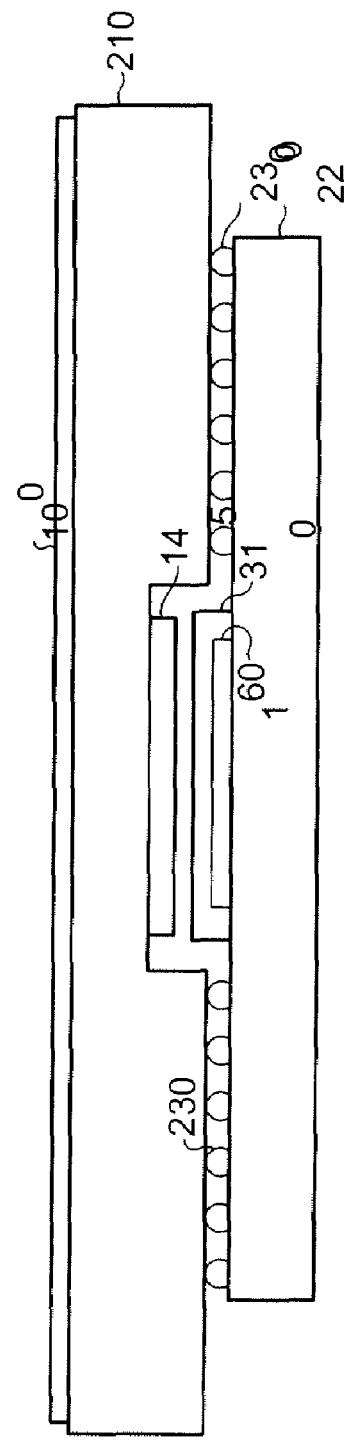

FIG. 6 shows opposing side views of one embodiment of a 2-D photodiode detector array according to one embodiment of the present invention. In this embodiment of the present invention, the first and second substrates 210, 220 are not of the same dimensions. For various reasons including cost savings the second substrate 220 can be reduced in size as long as it is sufficient to house the circuit die 160 and the various passive electronic components 290 necessary for signal processing. As is shown by FIG. 6 various configurations of the first substrate 210, the photodiode array 100, the shield 145, the second substrate 220, and the circuit die 160 are possible without departing from the spirit and intent of the present invention. FIG. 6 further illustrates the positioning of the shield 145 associated with the first substrate 210 in relation to the circuit die 160 associated with the second substrate 220. While the circuit die 160 is shown encapsulated 310 in this embodiment, it should be noted that a space remains between the circuit die 160 and the shield 145 and that the shield 145 is of the same dimensions or larger than the circuit die. In other embodiments of the present invention the shield 145 can be attached directly to the back of the circuit die 160.

Figure 7:
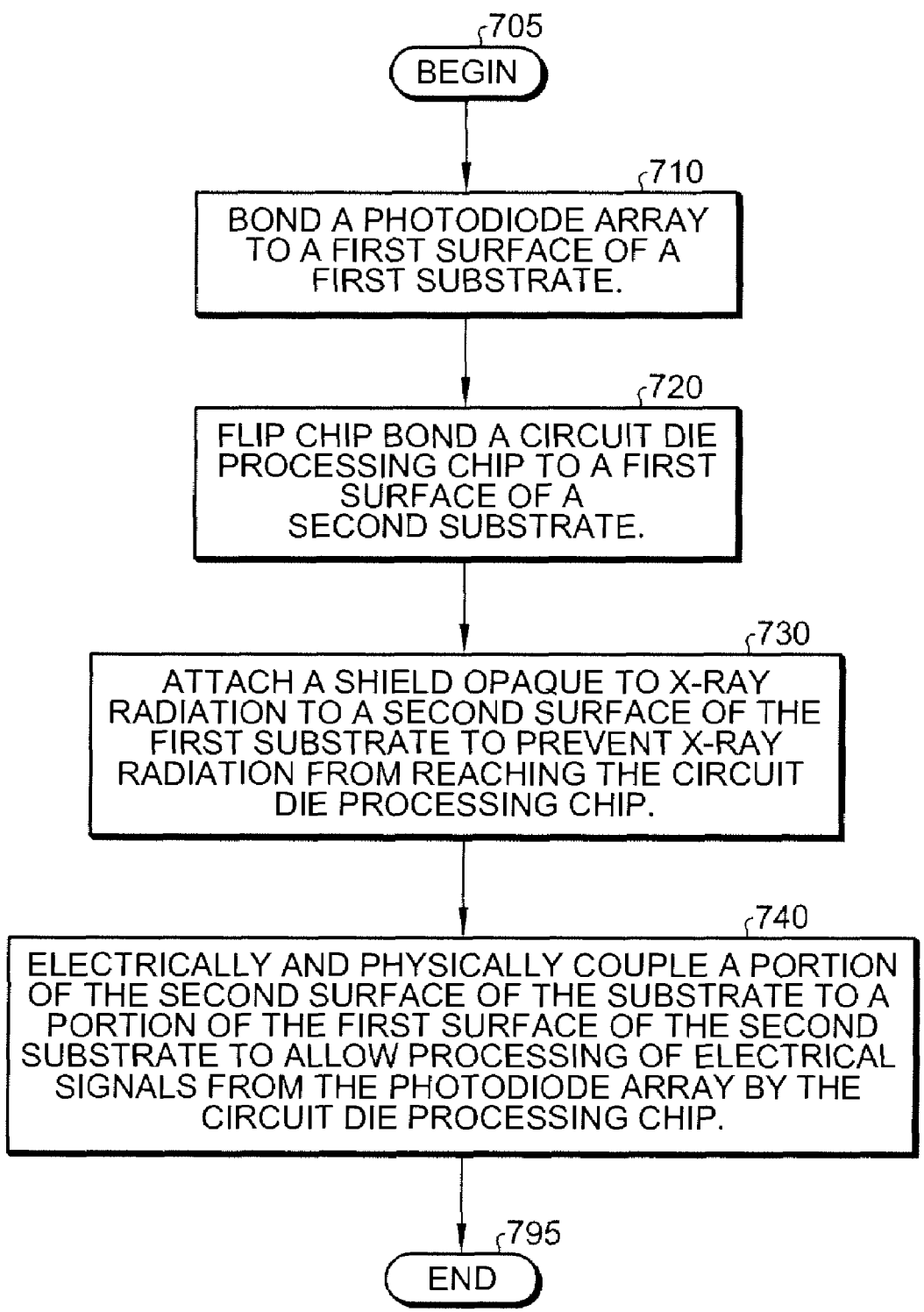
FIG. 7 is a flow chart for an embodiment of a method for creating a 2-D photodiode detector array according to one present invention.

FIG. 7 is a flow chart for an embodiment of a method for creating a 2-D photodiode detector array according to one present invention. A photodiode array having two or more photodiodes is bonded 710 to a planar first surface of a first substrate so as to electrically couple each photodiode comprising the array to the first substrate. Electrically conductive transmission paths within the first substrate convey the electrical signals from each photodiode to the substrates' opposite second surface. The substrate is of sufficient rigidity to provide a distortional free structure for the photodiode array and is of a material possessing similar coefficient of thermal expansion as the photodiode array.

A circuit die processing chip is flip chip bonded 720 to a portion of a first surface of a second substrate. Receiving points, capable of receiving electrical signals from the photodiodes and located on another portion of the first surface of the second diode, are coupled to the circuit die via electrically conductive transmission paths within the second substrate. A shield, opaque to X-ray radiation is attached 730 to the opposing side of the first substrate and positioned so not to interfere with the two or more connecting points for the transmission paths from each photodiode, yet positioned so as prevent X-ray radiation from reaching the circuit die processing chip. Connecting points associated with the electrically conductive transmission paths of the first substrate are aligned with and electrically coupled 740 with the receiving points associated with the second substrate using BGA solder bumps. The first substrate and the second substrate are further aligned to interpose the shield associated with the first substrate between the circuit die of the second substrate and the incoming X-ray radiation. The joining of the two substrates and their various components is accomplished so as to preserve a buffering space between the shield and the circuit die for thermal and electrical isolation. Electrical signals from each photodiode are thereafter transmitted through the first substrate via the transmission paths, the BGA connection between the substrates, and the transmission paths associated with the second substrate to the circuit die.

These and other implementation methodologies for creating a 2-D photodiode array detector having a circuit die flip chip bonded to at least one substrate can be successfully utilized according to various embodiment of the present invention. Presently preferred embodiments of the present invention and many of its improvements have been described with a degree of particularity. It should be understood that these descriptions have been made by way of example, and that the invention is defined by the scope of the following claims.

Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The Applicant hereby reserves the right to formulate new claims to such features and/or combinations of such features during the prosecution of the present application or of any further application derived therefrom.

I claim:

1. A two component detector, comprising:
   a photodiode array comprising two or more photodiodes wherein each photodiode is capable of converting light to an electrical signal;
   a first substrate having a first surface and a second surface opposite the first surface, wherein the first surface of the first substrate is bonded to the photodiode array, and wherein the first substrate comprises two or more analog electrically conductive paths individually routed through the first substrate leading from the first surface of the first substrate to a portion of the second surface of the first substrate, and wherein each photodiode is coupled to a unique one of the two or more electrically conductive paths at the first surface of the first substrate;
   a shield attached to the second surface of the first substrate;
   a second substrate having a first surface and a second surface wherein a portion of the first surface of the second substrate is joined to the portion of the second surface of the first substrate coupling each one of the two or more analog electrically conductive paths of the first substrate to a unique one of two or more analog electrically conductive paths individually routed through the second substrate;
   a die comprising circuitry for processing each electrical signal wherein the die is directly flip chip attached to the first surface of the second substrate coupling each unique analog electrically conductive path in the second substrate to the die; and
   two or more digital electrically conductive paths individually routed through the second substrate coupling the die to a passive electronic component directly attached to the second surface of the second substrate, said digital electrically conductive paths being isolated from the analog electrically conductive paths.

2. The detector of claim 1, wherein the shield is housed in a recessed region of the second surface of the first substrate, the recessed region possessing sufficient volume to house the shield.

3. The detector of claim 1, wherein the shield is of dimensions equal or larger than the die.

4. The detector of claim 1, wherein the shield is opaque to X-ray radiation.

5. The detector of claim 1, wherein the shield is substantially composed of material possessing an atomic number in excess of 70.

6. The detector of claim 1, wherein each unique one of the two or more electrically conductive paths of the second substrate is coupled to the unique one of the two or more electrically conductive paths of the first substrate using ball grid array solder bumps.

7. The detector of claim 1, wherein the second surface of the second substrate is substantially planar and capable of housing passive electronic components.

8. The detector of claim 1, wherein the die is positioned on the first surface of the second substrate so as to underlay the shield as viewed from the photodiode array.

9. The detector of claim 1, wherein the shield and the die are positioned to create a thermally insulating buffer between the die and the shield.

10. An X-ray radiation detector, comprising:
    a first substrate having a first surface bonded to a detector array having two or more detectors wherein each detector is capable of generating an electrical signal, and wherein the first substrate includes two or more electrically conductive analog paths routed individually through the first substrate, and wherein for each detector one of the electrically conductive paths transports the electrical signal to one of two or more unique path connecting points on a second surface of the first substrate;
    a second substrate having a first surface and two or more electrically conductive analog paths individually routed through the second substrate and, on the first surface of the second substrate, two or more unique path receiving points, wherein one of the two or more unique path receiving points corresponds to the one of the two or more unique path connecting points of the first substrate, and wherein each unique path connecting point of the first substrate is bonded to each unique path receiving point of the second substrate using ball grid array solder bumps, and wherein each unique path receiving point is coupled to a circuit die via one of two or more electrically conductive analog paths, and wherein the circuit die is directly flip chip bonded to the second substrate;
    a shield attached to the first substrate interposed between the detector array and the circuit die such that an insulating space remains between the circuit die and the shield and;
    two or more electrically conductive digital paths individually routed through the second substrate coupling the circuit die to a passive electronic component directly attached to the second surface of the second substrate, said electrically conductive digital paths being isolated from the electrically conductive analog paths.

11. The X-ray radiation detector of claim 10, wherein each detector comprises a photodiode, and wherein at least one surface of the photodiode is bonded to a scintillator crystal capable of converting X-ray radiation into light, and wherein each photodiode is capable of converting light into electricity.

12. The X-ray radiation detector of claim 10, wherein the circuit die is encapsulated.

13. The X-ray radiation detector of claim 10, wherein the shield is positioned on the second surface of first substrate.

14. A method for shielding a circuit die in a photodiode detector array, the method comprising:
    bonding the photodiode detector array to a first surface of a first substrate wherein each photodiode of the detector array is capable of producing an analog electrical signal;

transporting the analog electrical signal of each photodiode by an electrically conductive analog path unique for each photodiode that is individually routed through the first substrate to a unique connecting point on at least a first portion of a second surface of the first substrate;

connecting electrically each unique connecting point of the first substrate to a corresponding unique receiving point on a first portion of a first surface of a second substrate using ball grid array solder bumps;

conveying the analog electrical signal of each photodiode from the unique receiving point to the circuit die by a unique electrically conductive analog path that is individually routed through the second substrate for each unique receiving point wherein the circuit die is directly flip chip bonded to a second portion of the first surface of the second substrate;

attaching a shield to a second portion of the second surface of the first substrate so as to be interposed between the photodiode detector array and the circuit die and wherein the shield is positioned so as to overlay the circuit die as viewed from the photodiode detector array; and conveying a digital electrical signal from the circuit die to a passive electronic component attached to a portion of a second surface of the second substrate by a unique electrically conductive digital path that is individually routed through the second substrate, said unique electrically conductive digital path being isolated from the unique electrically conductive analog path.

15. The method of claim 14, wherein the shield is located in a recessed region of the second substrate.

16. The method of claim 14, wherein a space void of material remains between the shield and the circuit die.

17. A two component detector, comprising:
a first substrate having a first surface bonded to a photodiode array, the photodiode array being electrically coupled to the second surface of the first substrate;
a shield attached to the second surface of the first substrate; and
a second substrate having a first surface directly flip chip bonded to a processing chip, the processing chip being electrically coupled to the first surface of the second substrate, and a second surface bonded to a passive electronic component, the passive electronic component being electrically coupled to the processing chip,
wherein a portion of the first surface of the first substrate is physically and electrically joined to a portion of a second surface of the second substrate to allow processing of analog electrical information delivered via individually routed paths through the first and second substrates from a plurality of photodiodes in the photodiode array by the processing chip and wherein digital electric information from the processing chip is delivered to the passive electronic component via individually routed paths through the second substrate that are isolated for paths delivering analog electrical information.

18. The two component detector of claim 17, wherein the shield and the processing chip are not in physical contact.

19. The two component detector of claim 17, wherein the shield prevents X-ray radiation from reaching the processing chip.

20. The two component detector of claim 17, wherein the first substrate and the photodiode array comprise a first component, and the second substrate and the processing chip comprise a second component, and wherein the operational functionality of each component can be determined independently.

* * * * *